United States Patent
Duvinage et al.

(10) Patent No.: US 12,265,288 B2
(45) Date of Patent: Apr. 1, 2025

(54) SYSTEM FOR PROVIDING A MAGNETIC FIELD FOR A SAMPLE

(71) Applicant: ATTOCUBE SYSTEMS AG, Haar (DE)

(72) Inventors: Christopher Duvinage, Munich (DE); Armin Schöning, Pliening (DE); Luca Gragnaniello, Munich (DE)

(73) Assignee: ATTOCUBE SYSTEMS AG, Haar (DE)

( * ) Notice: Subject to any disclaimer, the term of this patent is extended or adjusted under 35 U.S.C. 154(b) by 1085 days.

(21) Appl. No.: 17/174,809

(22) Filed: Feb. 12, 2021

(65) Prior Publication Data

US 2021/0278709 A1 Sep. 9, 2021

(30) Foreign Application Priority Data

Feb. 20, 2020 (DE) .................... 102020104497.6

(51) Int. Cl.
*H01F 6/00* (2006.01)
*G01R 33/3815* (2006.01)
*G02F 1/09* (2006.01)

(52) U.S. Cl.
CPC ......... *G02F 1/092* (2013.01); *G01R 33/3815* (2013.01); *H01F 6/00* (2013.01)

(58) Field of Classification Search
CPC ...... G01R 33/34015–33/3403; G01R 33/3804; G01R 33/3815
See application file for complete search history.

(56) References Cited

U.S. PATENT DOCUMENTS

| | | | |
|---|---|---|---|
| 2016/0341778 A1* | 11/2016 | Kawakami | G01R 33/1238 |
| 2018/0143273 A1 | 5/2018 | Martien et al. | |
| 2018/0301261 A1 | 10/2018 | Dael et al. | |

FOREIGN PATENT DOCUMENTS

| | | |
|---|---|---|
| DE | 19908433 A1 | 9/1999 |
| EP | 0293723 A2 | 12/1988 |
| EP | 3822992 A1 | 5/2021 |
| JP | H08-248001 A | 9/1996 |
| JP | 2004325251 A | 11/2004 |
| JP | 2006337107 A | 12/2006 |
| JP | 2008-058242 A | 3/2008 |
| JP | 2010-032551 A | 2/2010 |
| JP | 2014-149221 A | 8/2014 |

OTHER PUBLICATIONS

"Notification of Reasons for Refusal, mailed Feb. 15, 2024, from corresponding JP application No. 2021-023933."
Montana Instruments Corporation: Magnet Integrations—Third-Party External Magnets, Bozeman, MT 59715, USA, 2018, 2 pages.
German Patent Application No. 102020104497.6, Office Action mailed on Oct. 12, 2021, 12 pages.
Japanese Office Action as Issued on Jul. 23, 2024 in Respect to Counterpart Japanese Patent Application No. 2021-023933 and Its English Translation.

* cited by examiner

*Primary Examiner* — Ramon M Barrera
(74) *Attorney, Agent, or Firm* — Amster, Rothstein & Ebenstein LLP

(57) ABSTRACT

A system for providing a magnetic field for a sample includes a first contact surface for thermally contacting the sample and a second contact surface, which is in thermal contact with at least one magnetic element.

10 Claims, 2 Drawing Sheets

SYSTEM FOR PROVIDING A MAGNETIC FIELD FOR A SAMPLE

CROSS-REFERENCE TO RELATED APPLICATIONS

This application claims priority to German application no. DE 102020104497.6, filed Feb. 20, 2020, the contents of which are incorporated by reference in their entireties.

FIELD OF INVENTION

The invention relates to a system for providing a magnetic field for a sample, as well as a table.

BACKGROUND OF INVENTION

In many high-precision, and correspondingly highly sensitive, optical experiments, such as for example those of the maximum resolution and therefore extremely sensitive Super Resolution Optical Microscopy or also of quantum optics, complex measurement setups consisting of a large number of optical components (such as mirrors, objects, collimators, diaphragms, illumination elements) are arranged on optical tables or on a flat table-like structure with an optical breadboard. The measurement accuracy is limited by environmental influences such as vibrations, thermal effects or electromagnetic noise. Many such experiments are therefore carried out under conditions that are as low-vibration as possible, and also cryogenic, at the location of a sample to be measured.

Furthermore, for the investigation of magneto-optical phenomena, it is also desirable, in addition to the above-named conditions, to be able to apply a magnetic field in a targeted manner. Various approaches have been proposed for this. For example, it is known to use a cryogen-free HTS magnet (HTS, high-temperature superconductor) in order to generate a magnetic field in the area of an optical sample. Here, the magnet is arranged around a bore, in which a sample can be arranged and manipulated. Ambient temperature prevails in this bore. Here, the magnet is held by a cooling system, in order to insulate it mechanically from the magneto-optical setup (Wolfus et al., "Compact HTS Cryogen-Free magnet for magneto-optics Research Setup", IEEE Transactions on Applied Superconductivity, Vol. 15, No. 2, June 2005).

An important challenge here is to ensure access to the investigated sample that is as easy and flexible as possible, in order to be able to manipulate it and carry out measurements on it.

The object of the invention is to provide a system of the type named at the beginning, in which magneto-optical experiments of various designs can be carried out with the highest resolution in a flexible and easy manner.

SUMMARY

This object is achieved by a system with the features of claim 1. Advantageous embodiments and developments of the invention are specified in the dependent claims.

The system according to the invention for providing a magnetic field for a sample comprises a first contact surface for thermally contacting the sample and a second contact surface, which is in thermal contact with at least one magnetic element. Furthermore, a third contact surface can be provided in the system, which is in turn in thermal contact with at least one further magnetic element. Moreover, in principle the number of contact surfaces and magnetic elements in thermal contact with them is not limited.

The magnetic element is formed to generate a magnetic field actively or passively. In particular, it can be formed as an electromagnetic element or comprise one, and it can, for example, comprise a coil; when a coil is mentioned in the following this is not intended to limit the use of a differently formed magnetic element or electromagnetic element, unless features explicitly restricting to a coil are specified in the context. Furthermore, the magnetic element can be a permanent magnetic (ferromagnetic) material.

In the invention, a thermal decoupling of the magnetic elements and the sample is advantageously achieved. The cooling of the magnetic elements, in particular of a current-carrying coil, is effected through a direct or indirect thermal coupling to the second contact surface and can therefore be regulated according to its requirements, while at the same time the temperature of the sample is set through the direct or indirect thermal coupling to the first contact surface and can therefore be chosen, and optionally changed, according to the specific requirements of the experiment.

A third, and all further contact surfaces possible in principle and the magnetic elements located thereon and being in thermal contact with these contact surfaces are especially formed such that they are thermally decoupled from the sample and also from each other. The latter offers the possibility of combining a wide variety of magnetic elements for generating a magnetic field on the sample and of adding each individually generated magnetic field to form an absolute magnetic field and thus possibly intensifying it.

In a design of the invention, the at least one magnetic element is fixed to a low-temperature shield, wherein the low-temperature shield is in thermal contact with the second contact surface. In particular, the magnetic element is therefore indirectly in thermal contact with the second contact surface via the low-temperature shield. Advantageously, the magnetic element can be cooled particularly easily through the thermal coupling to the low-temperature shield. The same applies to a third contact surface as well as further contact surfaces possible in principle. In addition, it can very easily be arranged close to the sample, without having to reduce the volume available for the sample too greatly for this. In addition, a relatively large installation space is available for the magnetic element in the area of the low-temperature shield, with the result that one or more magnetic elements can be formed differently and arranged very flexibly.

It is provided in particular that the first and second contact surfaces, as well as possibly further contact surfaces, as well as the low-temperature shields, the magnetic elements and the sample, are arranged under high vacuum conditions, in particular under a vacuum bell jar. Through the high vacuum, thermal insulation is achieved between different objects and areas at different temperatures.

The system can be formed, for example, such that the sample is arranged in a sample volume, and in particular in a sample holder, which can be thermally coupled to the first contact surface. This means that the thermal contacting of the sample can be effected directly or indirectly over further elements, for instance the sample holder. Then, the low-temperature shield can be formed such that it is pulled over the sample or the sample holder and surrounds it at least laterally, optionally on all sides, except for the base surface with the first and second contact surfaces. The method is the same when further contact surfaces with further magnetic elements are present. A vacuum bell jar, also pulled over, defines a vacuum area, out of which air can be pumped.

Through the thermal contacting of the low-temperature shield with the second contact surface, the shield can be cooled to a specific temperature. Further contact surfaces with further low-temperature shields can likewise be cooled to a typically higher temperature. With such a setup, particularly low temperatures can be generated in the area of the sample, for example, by cooling the low-temperature shields to temperatures lower than room temperature in a cascade-like manner in the vacuum. Towards the sample, the low-temperature shields, and thus the contact surfaces and magnetic elements, are cooled in such an example successively to lower temperatures and the sample holder, or the sample, is cooled to a final, even lower, temperature.

Furthermore, it can be provided that individual low-temperature shields are designed vacuum-tight with respect to each other and with respect to the vacuum bell jar. In the process, the vacuum bell jar and the low-temperature shields delimit at least two different volumes, in which, for example, different pressure conditions can be produced and in which optionally different gases and gas mixtures can be present.

The thermal decoupling is further achieved in particular by decoupling the first and second contact surfaces, as well as further contact surfaces possible in principle, from each other, with the result that different temperatures can be set. A thermal coupling between elements which are thermally coupled to the first, the second, as well as further contact surfaces possible in principle, is avoided as far as possible, for instance by using materials of low thermal conductivity, in order to form an optionally necessary mechanical coupling. A resulting heat flow is hereby minimized. The vacuum further contributes to a thermal decoupling of the sample and the low-temperature shields, also from each other.

The system differs from known approaches among other things in that there are arranged at least one magnetic element, in particular for applying a magnetic field to the sample, neither outside the vacuum bell jar at room temperature and at a great distance from the sample, nor inside the area directly around the sample and in particular not in the same temperature stage as the sample, and at least one further, but also further contact surfaces possible in principle, each at least in thermal contact with a magnetic element. Above all because the magnetic element or the magnetic elements, respectively, are not arranged directly next to the sample and/or thermally contacted with the same first contact surface, the temperatures of sample and magnetic elements can be regulated differently, for instance in order to carry out the measurements on the sample in a specific variable temperature range with constant cooling of the magnetic element. In particular, in the process, the generated magnetic field remains constant and is not negatively affected by temperature fluctuations. This means that the thermal decoupling of the sample and the elements can be utilized to widen the spectrum of possible experiments.

In the process it can be provided that, by means of the first contact surface, it is possible to achieve a cooling of the sample, or of further objects that are in thermal contact with the first contact surface, to a temperature below 25 K, preferably below 15 K, further preferably below 10 K, further preferably to 4 K. Furthermore, by means of the first contact surface, it is possible to achieve a cooling to a temperature of at most 1.5 K, preferably at most 1 K, at most 100 mK or at most 10 mK. In the process, the invention is not generally restricted to a specific temperature range. Advantageously, as a result, sources of thermal interference for highly sensitive measurements can be largely reduced.

Furthermore, it can be provided that the temperature that is reached through a thermal contacting of the first contact surface can be regulated to a specific value. For example, the temperature of the first contact surface, and thus in particular also of the sample thermally contacted with it, can be settable to a value of up to 100 K, preferably up to 200 K, further preferably up to 300 K, further preferably up to 350 K. In particular, the temperature of the sample can thereby be set. The first contact surface is formed in particular as a cryogenic plate by means of which the temperature can be set, in particular within a specific interval.

In the process it can further be provided that, by means of the second contact surface, it is possible to achieve a cooling of the low-temperature shield, and thus in particular also of the magnetic element that is in thermal contact with it, to a temperature below 150 K, preferably below 100 K, further preferably below 70 K, further preferably to 50 K. The second contact surface is in particular cooled by a cooling unit such that this temperature of the magnetic element is also achievable during its operation, in particular in the case of a heat input due to electric current when a magnetic field is generated. This cooling is also achieved in particular when the elements that are in thermal contact with the first contact surface, in particular the sample, has temperatures in a range of up to 100 K, preferably up to 200 K, further preferably up to 300 K, further preferably up to 350 K. Furthermore, a possibly third, as well as further contact surfaces possible in principle, can likewise be cooled to the named temperatures or any desired intermediate temperatures, with the result that the set temperature corresponds to the operating conditions of the respective magnetic element.

For example, the first and second contact surfaces can be thermally connected to a refrigerator which provides two temperature stages. The temperatures reached at the first and second contact surfaces then correspond in particular to the temperature stages that can be provided by the refrigerator. In the invention, the first and second contact surfaces can be cooled in particular by means of a so-called "closed-cycle cryocooler" or "closed-cycle refrigerator" (CCR). A third, as well as further contact surfaces possible in principle, can likewise be thermally connected with a third temperature stage, or further temperature stages possible in principle, via a closed-cycle refrigerator: in the process, the complete system, comprising the vacuum bell jar, the low-temperature shields, as well as the first and second, as well as further contact surfaces possible in principle, cooled via a CCR, in particular forms a so-called "closed-cycle cryostat". Here, the contact surfaces are cooled by heat conduction and in particular not by means of a liquid or in a similar manner.

Furthermore, a closed-cycle refrigerator can be combined with a large number of other cooling possibilities, which provide a large number of contact surfaces thermally insulated from each other. Preferred here are combinations of a CCR and a helium-4 evaporation refrigerator, a helium Joule-Thomson decompression refrigerator, a helium-3/helium-4 dilution refrigerator or a magnetic refrigerator, which uses the principle of adiabatic demagnetization refrigeration. The thermal functional principle, as well as the further combination, possible in principle, of the refrigerators with each other makes a large number of contact surfaces possible per se, which can be used for the thermal contacting of at least one magnetic element.

The magnetic element can, for instance, be attached directly to the low-temperature shield or it can be fixed to it indirectly, for instance by means of a fixing device. Furthermore, the magnetic element and the low-temperature shield can be formed as an integrated unit. It can further be formed as an electromagnetic element, for example, or comprise one. It comprises a coil and/or a core, for example, wherein in principle each of the magnetic elements can be fixed to the low-temperature shield individually or in combination. In particular, the low-temperature shield is formed such that the magnetic element is integrated with it, for instance as a fixedly attached magnetic element; in this case, the system can advantageously be formed particularly easily since the low-temperature shield can be handled together with the magnetic element for assembling the system as a whole.

The magnetic element can further be connected detachably or fixedly to the low-temperature shield. It can also be integrated in the low-temperature shield, for instance through insertion into a recess or opening in the low-temperature shield.

In a further design, the magnetic element is coupled to a control unit, wherein the control unit is set up to apply a current flow to the magnetic element in dependence on a predefined magnetic field parameter, such that the magnetic field provided at the sample has the predefined magnetic field parameter. In particular, a plurality of magnetic elements can be provided here, which can be actuated by the control unit. Advantageously, the sample can thereby be exposed to a particularly precisely defined magnetic field.

The magnetic field parameter can relate, for instance, to a direction, strength and/or temporal variation of a magnetic field, in particular at a specific position, in particular at the position of the sample, or in a defined sample volume. The magnetic field can be viewed as a vector in one, two or three dimensions, as well as variable over time. In particular, through the actuation of several magnetic elements, one magnetic field, corresponding to a specific magnetic field vector which defines the magnetic field acting on the sample, can be generated through vectorial superposition of magnetic fields that can be generated and regulated separately. The predefined magnetic field parameter can be acquired in various ways, for instance through a user input, or it can be determined automatically, for instance while performing a defined type of measurement.

In a further design, a predefined temperature value is further set for the sample, the magnetic element and/or the low-temperature shield. For this, a control signal is generated, in particular by the above-mentioned control unit or a further control unit, and transmitted to a device, which is connected to the first and/or second contact surface and provides for temperature control or cooling via the respective contact surface. The method can be the same for a third, as well as in principle further contact surfaces, and magnetic elements in thermal contact with them.

In an embodiment of the system, it is provided in particular that a cooling is effected via the first and/or second contact surface by means of a so-called "closed-cycle" refrigerator (CCR). The cooling of the contact surfaces is effected here without the use of a refrigerant, but rather through heat conduction.

In a development, the system comprises at least one further magnetic element, which is also in thermal contact with the second contact surface and which is arranged in a pair with the magnetic element. The magnetic elements arranged in pairs are arranged on opposite sides of the sample such that they have a common axis of a magnetic field that can be generated by them. Advantageously, a homogeneous and strong magnetic field can thereby be generated particularly easily.

The further magnetic element can in particular be in thermal contact with the low-temperature shield, wherein the thermal contact with the second contact surface is produced in particular indirectly via the low-temperature shield. The magnetic elements are arranged in particular on opposite sides of the low-temperature shield, are fixed to it and/or are in thermal contact with it.

In particular, the magnetic elements comprise two coils, which can be arranged concentrically or in a Helmholtz configuration, for example. In particular, the magnetic fields generated by the coils of the coil pair then run in the same direction and intensify each other, with the result that an essentially homogeneous magnetic field is generated between the coils. In the process, it can in particular be provided that the two magnetic elements arranged in pairs comprise coils which are arranged equidistantly on opposite sides of the sample and essentially lie on a lateral surface of an imaginary right circular cylinder. In particular, the coil axes—lying one above the other in a Helmholtz configuration or a concentric arrangement, for example—run through the sample.

Furthermore, for example to generate a large magnetic field gradient near the sample, it can be provided that the magnetic fields are generated such that they run in opposite directions to each other. In particular, a coil pair which is arranged as described above can be actuated such that the magnetic fields generated due to the current flow through the coils are opposed to each other; this is achieved in particular in an anti-Helmholtz configuration.

Other configurations of the magnetic elements, and optionally of the coils included in them, are likewise covered by the invention, in particular also further combinations of coil diameters, alignments of the magnetic elements and arrangements displaced relative to each other.

In a design, two pairs of magnetic elements, arranged in pairs, are in thermal contact with the second contact surface and are arranged such that the axes of the magnetic fields that can be generated by means of the magnetic elements, arranged in pairs with each other in each case, run perpendicular to each other. Precisely one pair or at least two pairs can be provided, with the result that three or more pairs are also covered by the invention. Advantageously, the magnetic field generated can thereby be defined and set particularly easily in terms of magnitude and direction.

In particular, the two pairs of magnetic elements are in thermal contact with the low-temperature shield and/or are fixed to it.

In particular, the magnetic elements, arranged in pairs with each other, are actuated together such that a homogeneous magnetic field is generated in an area between the elements, in particular in the sample area. Furthermore, in each case precisely two pairs of magnetic elements, arranged in pairs with each other in each case, can each define a magnetic axis, which can coincide in particular with a common coil axis. The magnetic axes of the two pairs can intersect each other, in particular at a right angle, and thus span a plane within which various magnetic fields, which can be vectorially parameterized, can be generated. The spanned plane can in particular run horizontally, that is in particular perpendicular to an axis of the low-temperature shield.

In particular, at least one further pair of magnetic elements, arranged in pairs with each other, is provided, wherein an axis of a magnetic field that can be generated by means of the further pair runs to the two axes of the two pairs of magnetic elements. This means that the axis defined by the further pair can run perpendicular to the plane which is spanned by the magnetic axes of two pairs of magnetic elements. In particular, by the named axes can be meant the x-, y- and z-axes, which are arranged in particular perpendicular to each other and form the axes of a three-dimensional coordinate system conceived as a Cartesian coordinate system. In particular, a horizontal x-y plane is defined, which is spanned by magnetic axes, running perpendicular to each other, of two pairs of magnetic elements. Furthermore, a vertical z-axis is defined, which runs along a magnetic axis of a further pair of magnetic elements. Here, "vertical" and "horizontal" are defined relative to the gravitational field of the Earth. Furthermore, "horizontal" can be defined as parallel to a table surface on which the system is arranged. Furthermore, "vertical" can be defined as parallel to a longitudinal axis of a sample holder and/or of the low-temperature shield.

Furthermore, at least one further magnetic element, to which in particular a perpendicularly running magnetic axis can be assigned, is in thermal contact with the first contact surface. The further magnetic element can thereby advantageously be cooled together with the sample and in particular reach a particularly low temperature.

In this case, a further magnetic element, which is thermally decoupled from the low-temperature shield, is provided in the system in addition to the magnetic element which is thermally coupled to it. For this, through the cooling in thermal contact with the first contact surface, a temperature of below 10 K, preferably of approximately 4 K or less, for instance at most 1.5 K, at most 1 K, at most 100 mK or at most 10 mK, can be reached, for example. In the process, the invention is not generally restricted to a specific temperature range.

In particular, the further magnetic element can be formed and arranged such that it generates a magnetic field which is perpendicular to the magnetic fields which can be generated by magnetic elements arranged in pairs with each other in each case. Advantageously, a predefined magnetic field vector, with magnitude and direction, can thereby be represented.

In particular, a further pair of magnetic elements, for instance a coil pair, can be provided, the common axis of which are perpendicular to the axes of one or two coil pairs in thermal connection with the low-temperature shield. For example, a magnetic field along a z-axis can be generated by the magnetic element in contact with the first contact surface, whereas magnetic fields in an x-y plane are generated by further magnetic elements, which in particular are in thermal contact with the low-temperature shield.

The thermal contacting of the magnetic element allows cooling to very low temperatures. If a correspondingly low temperature is reached through the thermal contact with the first contact surface, a superconductor, with a transition temperature which requires cooling to below 40 K, for example, can be used for this.

In a development, the magnetic element comprises a superconducting material, in particular a high-temperature superconductor. In particular, the superconducting material is formed such that it has a transition temperature above the operating temperature of the low-temperature shield; in this case, the superconducting state is reached when the low-temperature shield is cooled to its operating temperature. Advantageously, a high magnetic field can thereby be generated.

In the case of a superconductor which has been brought into a superconducting state in particular by cooling below its transition temperature, even very high currents, for instance in a superconducting coil, do not lead to a strong generation of heat due to Ohmic heating, as would be caused by an electrical resistance. The magnetic element, for instance a coil, can therefore be designed smaller and, in particular, with a smaller conductor cross section relative to the current strength. Furthermore, there is no need for additional cooling for the coil in order to minimize undesired additional heat input and to avoid damage due to the generation of heat caused by current.

A low-temperature superconductor (LTS), for instance a niobium-titanium superconductor, can be used, for example. NbTi, Nb3Sn, Nb3Al, Nb3Ge or MgB2, the transition temperatures of which are approximately 9.25 K, 18.3 K, 18 K, 23.2 K and 39 K, respectively, can be used as superconductor, for example. The superconducting state of the respective material is reached below the transition temperature. Despite its high transition temperature, MgB2 is usually counted as an LTS. In contrast, a high-temperature superconductor is typically referred to when the transition temperature of the material is approximately 30 K or higher, for instance above 70 K or 90 K to 140 K. In particular, a second-generation high-temperature superconductor can be provided.

Furthermore, in a design a semiconductor material can be used. Here, there are in particular so-called Weyl and Dirac semimetals, which can be utilized in the invention. Examples of materials from the family of the Weyl semimetals are NbP, TaP, NbAs, and TaAs. These are already used in a variety of ways, for example as photoelements, thermoelectric materials or in other contexts.

In particular, a cooling of the magnetic element to a temperature below the transition temperature can be achieved by means of the second contact surface, i.e. the element can be cooled such that the material assumes superconducting properties.

In a design, the magnetic element comprises a metal or semimetal. Advantageously, the thermal contacting with the low-temperature shield, and as a result indirectly with the second contact surface, is thereby utilized in order to dissipate the heat developing in the case of a high current and thereby to be able to generate a high magnetic field with conventional electromagnets. In particular, the high cooling capacity of known cooling devices is utilized for this purpose.

In particular, a material is provided which has a very low specific resistance and a very high thermal conductivity. This can be a metal, such as copper, aluminum, platinum or silver, for example. However, Weyl and Dirac semimetals are also known, for example, which can come into question for such an application.

Although such a magnetic element can typically only generate smaller magnetic fields than a superconductor, these can already be sufficient for a range of applications, however. Furthermore, such magnetic elements can be substantially more cost-effective to produce.

Furthermore, a combination of magnetic elements can be used, which partly comprise superconducting elements and partly comprise conventional, non-superconducting elements. Furthermore, a combination of different superconducting elements, for instance an LTS with an HTS, can preferably be realized on different contact surfaces.

In a further design, the low-temperature shield comprises a circumferential wall, which surrounds the sample and which can be provided with an optical access opening. The wall can in particular be formed cylindrical. It can further have a cross section with a different geometry, for instance a rectangular or square cross section. Advantageously, a shielding effect can thereby be achieved by the low-temperature shield, in particular from heat radiation of a further low-temperature shield which is operated at a higher temperature or of a room temperature surrounding the system.

An optical access to the interior of the system, in particular into the area of the sample, can be effected in various ways. An objective lens or another optical system with lenses can be provided in order to be able to couple signals in and/or out. Optical signals and fields can thus be brought to the sample or detected coming from the sample, for example. Alternatively or in addition, various optical accesses can be realized through free space or fiber-based.

In a development, the system comprises a module for thermal contacting with the first contact surface. In particular, the module is set up to receive a sample carrier, for instance by being pulled or placed over it. It can further be fixedly connected to the sample carrier, for instance in that the latter is integrated in the module.

This module is thermally coupled to the first contact surface. If it is a stage with a particularly low temperature, for instance a 4 K-stage, the module is correspondingly cooled. When a 4 K-stage is discussed in the following, this is not intended to mean a restriction to a specific temperature; in particular, with the module a lower temperature of at most 1.5 K, preferably at most 1 K, at most 100 mK or at most 10 mK can be reached, for example. The module can furthermore comprise magnetic elements, for instance a superconducting magnet, the transition temperature of which is chosen such that it is not reached in the arrangement in the system. Furthermore, it can be provided that the temperature of the module, and thus also of the sample, is variable, for instance in order to observe properties of the sample at different temperatures.

In a further design of the system, the low-temperature shield can be formed as a module which is formed separately from other elements of the system, for instance the module with a sample carrier, and thermally insulated therefrom inside the system. This further module is in particular in thermal contact with the second contact surface.

The module with the low-temperature shield can comprise an objective lens element, for instance, which as a result is likewise thermally coupled, directly or indirectly, to the first contact surface. The objective lens element is in particular formed to and arranged such that it allows an optical access to the sample, for instance because optical signals can be transmitted through the objective lens element to the sample and/or from the sample to a measurement sensor.

The integration of the objective lens element in the module allows an arrangement particularly close to the sample; as a result, a particularly high resolution can also be achieved due to a high numerical aperture. An arrangement close to the sample furthermore has the advantage that a particularly high collection efficiency is achieved, i.e. a particularly large number of photons can reach the objective lens element from the sample and be detected; this is of importance in particular in the detection of weak signals, for instance from single-photon sources. In known systems, with an objective lens, it is often difficult to achieve, from the outside, a small distance from the sample, which is arranged in a vacuum chamber and possibly surrounded by further elements, for instance electromagnets. Because the objective lens element is arranged in the module, the objective lens can be arranged in the vacuum chamber and accommodated together with any further devices which may be necessary.

Alternatively or in addition to an objective lens element, other devices can be present which allow an optical access for the supply of electromagnetic radiation to the sample and/or for the detection of electromagnetic radiation from the sample. A free space optical system or a fiber-based optical access can be provided, for example.

In a design of the invention, a cooling is effected by means of the second contact surface, wherein a higher temperature level can be reached than in the case of the first contact surface. In particular, it can be provided that the first contact surface is set up such that a stronger cooling can be achieved through it than in the case of the second contact surface. For example, the further module is formed as a 40 K- or 50 K-stage, which surrounds a module formed as a 4 K-stage and, for one thing, shields it from the surrounding room temperature and, for another thing, is thermally decoupled. The description as a 40 K- or 50 K-stage is also not intended to be restrictive; rather, various temperature levels can be reached. This means that the temperatures of the different modules or stages can be set and varied substantially, or at least within specific temperature ranges, independently of each other. For example, a superconducting magnetic element in thermal contact with the low-temperature shield can be kept permanently at a temperature below the transition temperature, whereas the temperature of the module arranged inside the low-temperature shield, in particular of a sample carrier or a sample, is varied.

The system can further be formed such that it is formed completely or partly as a fixedly or detachably assembled element; a high degree of integration is advantageously achieved as a result. In particular, it can be provided that an assembled element a vacuum bell jar, which faces the surroundings during operation and has the ambient temperature, for example, and the low-temperature shield are connected to each other. The system can then be obtained by placing this assembled element over a sample holder, for example. Furthermore, an assembled element can comprise the components of the system which are arranged inside the vacuum bell jar. For operation, such an assembled element is placed on the first and second contact surfaces such that the corresponding components are in thermal contact with the correct contact surface, for example.

The table according to the invention comprises a system formed according to the above description, wherein the first and second contact surfaces are formed in the area of a table top of the table. A particularly high degree of integration of the system with further components of a magneto-optical experiment can advantageously be achieved thereby. Furthermore, a particularly easy and safe operation is hereby made possible, wherein vibrations and other disturbances from the environment can further be prevented.

The integration in the table is effected in particular such that objects on the table, for instance parts of an experimental arrangement, can be adjusted and set in position and alignment relative to the contact surfaces.

The table is formed in particular as an optical table. It can be provided with at least one damping device, which damps the transmission of vibrations in the table surroundings to the table top and/or objects arranged on the table top via the table legs. The table top of an optical table typically comprises fixing points for elements used in an experiment the system can be fixed to one or more such fixing points.

Furthermore, an opening can be formed in the table, in particular in the table top, the which the system is inserted.

In a development of the invention, the system is at least partly integrated in the table. For example, the table top of the in particular optical table can have an opening in which the first and second contact surfaces or further contact surfaces possible in principle are arranged. The further elements of the system, in particular a vacuum bell jar, the low-temperature shield and the sample holder, are correspondingly thermally contacted with the first or second contact surface and in particular detachably fixed to the table top, for instance by means of screws.

In a method for operating the system according to the invention for providing a magnetic field for a sample, a first contact surface, which is in thermal contact with the sample, is cooled to a first temperature. A second contact surface, which is in thermal contact with a low-temperature shield, is cooled to a second temperature. In particular, the first and second temperatures are below an ambient temperature; for example, the first temperature is below 10 K, preferably 4 K; for example, the second temperature is below 70 K, is preferably 50 K or 40 K. In the process, the low-temperature shield is in thermal contact with a magnetic element. In particular, the magnetic element is actuated by a control unit such that a magnetic field with a predefined magnetic parameter is generated in the area of the sample.

The method is used in particular for operating the system according to the invention explained above and therefore has the same advantages.

BRIEF DESCRIPTION OF THE DRAWINGS

The invention is explained in more detail in the following with reference to the attached drawings. There are shown in.

DETAILED DESCRIPTION

Figure 1:
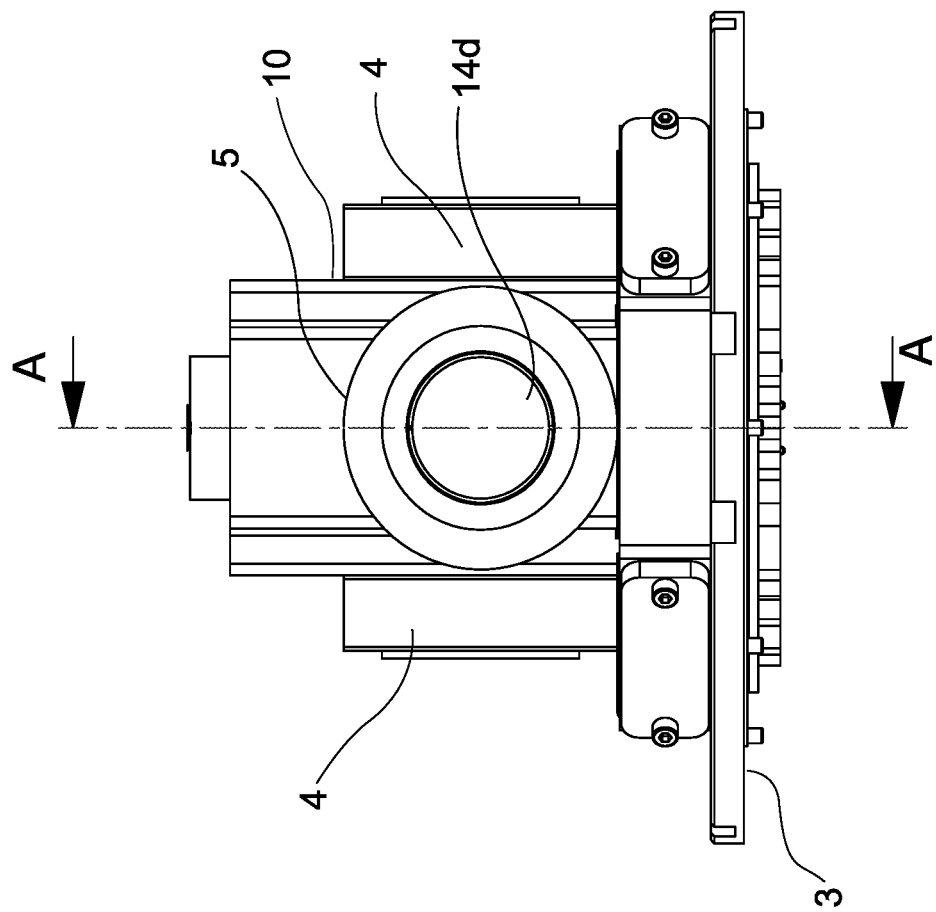
FIG. 1 a side view of a first embodiment example of the system according to the invention.

An embodiment example of the system according to the invention is explained with reference to FIGS. 1 and 2.

The embodiment example of the system is constructed in three stages, which is expressed by different hatching in the sectional drawing shown in FIG. 2: an outer stage, which is referred to in the following as "300 K-stage" 13, is formed as a module 13 and has approximately the current ambient temperature; a typical room temperature varies in a range around 300 K, for example, but is not restricted to it.

The 300 K-stage 13 is formed like a bell, which can be pulled over further elements and sealed to a base surface. In the context of the application, by "bell" is meant a structure, such as is also referred to as a "dome" or "chamber" depending on the context. This makes it possible to pump out air from inside the 300 K-stage 13 to produce a high vacuum. Appropriate connections for a vacuum pump are provided in the base area of the system, for example, and are not explained in more detail here. Through the vacuum inside the 300 K-stage 13, a thermal insulation of all elements in the interior is achieved, with the result that the transfer of thermal energy essentially only occurs through heat radiation and/or direct mechanical contact of elements. A base 3 of the 300 K-stage 13 can be screwed or otherwise secured to a base surface, for instance on a table top of an optical table.

Furthermore, it is provided that the 300 K-stage 13 has optical accesses 12a, 12b, 12c, which are formed as glazed openings, for instance, and are against the penetration of air into the vacuum. Further optical accesses are likewise provided, which are not visible in the representation. In further embodiment examples, optical accesses can be provided in a different number, type and shape. Through the optical accesses 12a, 12b, 12c, stealth can be guided into the interior of the 300 K-stage 13, for instance by coupling in a laser beam, and/or light can pass from the inside to the outside, with the result that optical measurements can be taken from the outside, for example.

Inside the 300 K-stage 13, a further module 10 is provided, which is referred to in the following as "50 K-stage" 10, without thus restricting it to a specific temperature. In the embodiment example, the 50 K-stage 10 acts as low-temperature shield 10, in order to be able to define in stages areas of lower temperature within the interior of the 300 K-stage 13. Because the low-temperature shield is cooled to a much lower temperature than the ambient temperature, for example to 50 K, wherein the invention is not restricted to this value however, the area enclosed by the low-temperature shield 10 can be shielded from the outside temperature and cooled to an even lower temperature more easily. For example, a further module 11, enclosed by the low-temperature shield 10, can thus be formed as "4 K-stage" 11 and cooled to a corresponding temperature, for instance to 4 K. However, the embodiment example does not restrict the invention to this value; for example, in other embodiment examples temperatures of at most 1.5 K, preferably at most 1 K, at most 100 mK or at most 10 mK can also be reached in the "4 K-stage" 11.

The cooling of the 50 K-stage 10, in the present case to approximately 50 K, is effected through contact with a second contact surface 2 in the base area. The contact surface 2 is connected to a refrigerator (not represented), which is formed as a "closed cycle refrigerator" (CCR) in the embodiment example, such that heat energy is extracted through the thermal contact with the surface until a defined temperature is reached.

In the embodiment example, it is provided that the 50 K-stage 10 comprises optical accesses 14a, 14b, 14c, which are arranged such that they lie along an optical axis with the optical accesses 12a, 12b, 12c of the 300 K-stage 13 such that the access possibilities described above, for instance for optical experiments, from the system surroundings into the space enclosed by the 50 K-stage 10, are made possible. Here too, as already described above for the 300 K-stage 13, further optical accesses can be provided, which are not represented in the embodiment example shown here.

In the embodiment example, inside the 50 K-stage 10 a further module 11 is provided, which is referred to in the following as "4 K-stage" 11. The 4 K-stage 11 is in thermal contact with a first contact surface 1 and is cooled by it, wherein the cooling is effected essentially analogously to the cooling of the 50 K-stage 10 described above. However, a much lower temperature can be reached here, for instance less than 10 K, less than 8 K or 4 K.

In the embodiment example, the 4 K-stage 11 comprises a sample holder 7, on which a sample 8 is arranged and which has actuators (not explained in more detail here) for manipulating the sample 8, in particular for positioning the sample 8. The sample holder 7 is formed such that it can position the sample 8 held therein in an area such that optical effects can be coupled in through the optical accesses 12a, 12b, 12c, 14a, 14b, 14c and/or optical signals can be coupled out. In the embodiment example, the sample holder 7 is cooled to the same temperature we the 4 K-stage 11, with the result that the sample 8 is also cooled correspondingly.

In the embodiment example, it is further provided that an objective lens element 9 is arranged in thermal contact with the 50 K-stage 10 such that it is pointed at the sample 8 at a short distance therefrom. Through the arrangement in contact with the 50 K-stage 10, the particular advantage results that the objective lens element 9 is thermally decoupled from the sample 8. This means that, even in the case of a change in the temperature of the sample 8, for instance if a variation in the temperature forms part of the conditions of an experiment, this does not result in temperature-related changes for example in the focusing or other drift phenomena.

In the embodiment example, the objective lens element 9 is mounted such that it can be manipulated via at least one actuator, for instance in order to prevent thermal drift and a defocusing caused by it, or in order to adapt the system for different samples and/or experimental arrangements. In the process, the position of the objective lens element 9 can be set, in particular in the vertical z-direction; in particular, a distance is set between the objective lens element 9 and the sample 8. However, in further embodiment examples, it can alternatively or additionally be provided that the position of the objective lens element 9 can be set in another way, in particular relative to the sample 8, for example in the horizontal x-y plane or in a specific direction. Furthermore, the location of the objective lens element 9 can be changeable in another way, for instance defined by a direction in space or by angles relative to the axes of the system. Depending on the design of the system, it is thus possible to be able to manipulate the arrangement of the objective lens element 9 freely or with specific limitations in three spatial dimensions, for example.

In the embodiment example, the objective lens element 9 is pointed at the sample 8 vertically from above, however other arrangements, in particular with several objective lens elements 9, are conceivable. The objective lens element 9 is suitable for operation in the region of the temperature of the 50 K-stage 10. Due to the arrangement inside the low-temperature shield 10, the objective lens element 9 can advantageously be positioned very close to the sample 8, which in turn allows a high numerical aperture and correspondingly high-resolution measurements. Furthermore, a particularly high collection efficiency is allowed, with the result that weak optical signals, for instance from single-photon sources, can be detected and measured. The objective lens element 9 is arranged such that its side facing away from the sample 8 is facing an optical access 14*a* of the 50 K-stage 10 as well as, in the further extension, an optical access 12*a* of the 300 K-stage 13. Through these optical accesses 14*a*, 12*a*, optical signals to the sample 8 can be coupled into the objective lens element 9 and directed at the sample 8. Conversely, optical signals from the sample 8 can pass through the objective lens element 9 to the optical accesses 14*a*, 12*a* and be detected there, for example.

In further embodiment examples, the objective lens element 9 can be in thermal contact with the 4 K-stage 11, integrated in the module of the 4 K-stage 11 or arranged and/or thermally contacted in another way.

In further embodiment examples, no objective lens element 9 is provided or it is formed in other ways, for instance without a lens optical system. A fiber-based optical access can be provided, for example, or an optical system can be provided for the free access of light beams to the sample or for the direct detection of light beams from the sample.

In the embodiment example, it is provided that magnetic elements 4, 5, 6, which are formed in this embodiment example as electromagnetic elements 4, 5, 6 with coils 4, 5, 6, magnetic fields can be generated along three axes that are perpendicular to each other. In further embodiment examples, at least one of the magnetic elements 4, 5, 6 is not formed electromagnetic, for instance through the use of a permanent magnet or in another way.

In the embodiment example, the magnetic fields generated by means of the coils 4, 5, 6, arranged in each case in pairs and concentric with each other, such that they are formed essentially homogeneous in the area of the sample 8 and are formed as superposed components. In particular, pairs of coils 4, 5, 6 can be formed and arranged in a Helmholtz configuration or in a similar configuration. Through a coordinated actuation of the current which is conducted through the coils 4, 5, 6, magnetic field vectors with a broad range of parameters can be generated in the area of the sample 8. The parameters that are important here comprise, for instance, a magnetic field strength and a magnetic field direction. Furthermore, one parameter can be the change of direction and/or strength of the magnetic field, wherein in particular a first derivative of at least one of the parameters is predefined with respect to time.

In the embodiment example, the coils 4, 5, 6 comprise superconducting materials. This results in the advantage that, if they are cooled to below the transition temperature of the superconductor materials used in each case, the coils 4, 5, 6 are capable of conducting a current practically without electrical resistance and very high current strengths can therefore be applied to them without this leading to substantial heating up due to Ohmic heating, and possibly to damage to the coils 4, 5, 6.

In the embodiment example, two pairs of coils 4, 5 are attached to the outside of the low-temperature shield 10 and thermally connected thereto. In the embodiment example, they are therefore cooled to a temperature of approximately 50 K. The coil pairs each consist of two coils 4, 5, which are arranged opposite each other in a Helmholtz configuration such that the sample 8 is located in the area of their common axis. The axes of the pairs of coils 4, 5, which are attached to the low-temperature shield 10, are perpendicular to each other and are arranged in a plane parallel to the plane of the optical table on which the system is constructed. In the following it is assumed that the axes run along an x- and y-axis, respectively. Through the thermal coupling to the low-temperature shield 10, the coils 4, 5 reach a temperature of approximately 50 K; high-temperature superconductors, which can be used in the superconducting state because they are already below their transition temperature here, are provided here as superconducting materials of the coils 4, 5.

Figure 2:
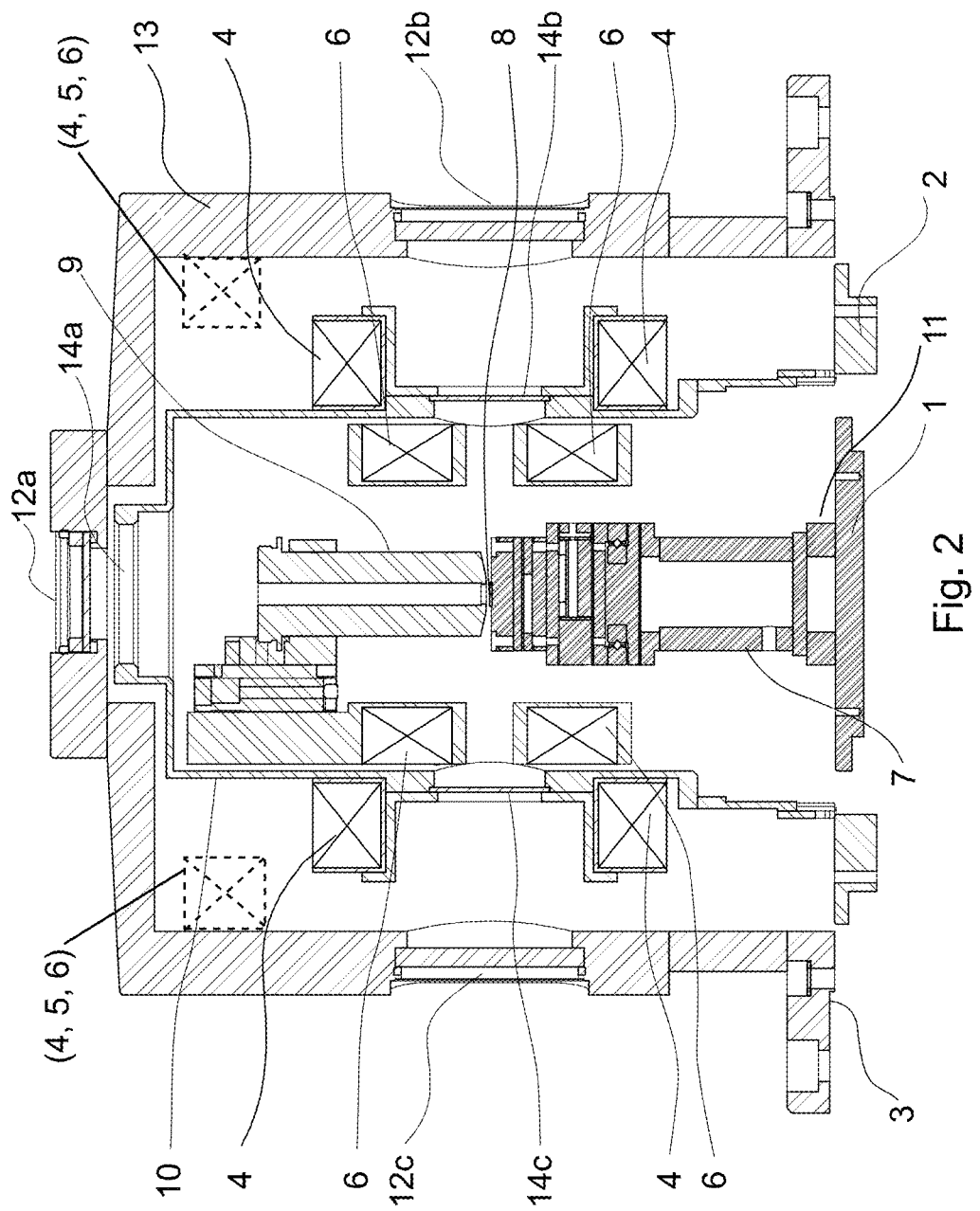
FIG. 2 a sectional representation of the embodiment example of the system according to the invention.

In the side view shown in FIG. 2, essentially the 50 K-stage is shown from the outside, wherein the coils 4 are shown on the right and left, while the view is pointed directly at the cross section of a coil 5 arranged perpendicular thereto. The cross section of the coil 5 is formed such that it runs around one of the optical accesses 14*d* formed in the 50 K-stage, through which the sample 8 on the sample holder 9 may be visible inside the 50 K-stage.

In the embodiment example, it is further provided that a further pair of coils 6 is attached to the inside of the low-temperature shield 10. Here too, the coil axes lie one above the other and run perpendicular to the x-y plane described above; in the following this direction is understood to be the "z-axis". A Helmholtz configuration is obtained, by means of which an essentially homogeneous magnetic field is generated along the z-axis in the area of the sample 8. Here too, a cooling to 50 K is achieved through the thermal contact with the low-temperature shield 10, and a high-temperature superconductor, which is already below its transition temperature here, is provided as current-carrying material of the coils 6. The coils 6 are therefore also operated in the superconducting state.

In a further embodiment example, the magnetic element 6, in particular comprising the coils 6, can be in thermal contact with the 4 K-stage 11, integrated in the module of the 4 K-stage 11 or arranged and/or thermally contacted in another way.

In particular, both the objective lens element 9 and the magnetic element 6 are thermally contacted with the 4 K-stage 11, or integrated in the 4 K-stage 11, for the generation of a magnetic field in the z-direction.

In further embodiment examples, magnetic elements 4, 5, 6 can be thermally and/or mechanically coupled to the various modules and stages 10, 11, 13 of the system in different configurations and combinations. In particular, magnetic elements 4, 5, 6 with semiconductor materials are thermally coupled to the 50 K-stage 10 or to the 4 K-stage 11 such that the temperatures necessary in each case to fall below the transition temperature are reached, and the corresponding magnetic elements 4, 5, 6 adopt their superconducting state. Furthermore, magnetic elements can be arranged outside the 300 K-stage 13.

In further embodiment examples, differently formed electromagnetic elements 4, 5, 6 can be provided. For example, configurations other than as coils can be used, other arrangements of coils and different materials can be used. The electromagnetic elements 4, 5, 6 can further be arranged in different areas and thermally contacted: for example, at least one electromagnetic element can be thermally contacted with the 4 K-stage 11; in this case, superconducting materials which have a very low transition temperature can be used in particular. Furthermore, at least one electromagnetic element can be arranged in the area of the ambient temperature, for example thermally contacted with the 300 K-stage 13, wherein non-superconducting materials are used in particular.

In further embodiment examples, at least one electromagnetic element can comprise a non-superconducting material, for instance copper. In this case, for instance in the case of a thermal contacting with the 50 K-stage, the cooling of the 50 K-stage can be utilized in order to efficiently dissipate the heat developing due to electrical resistance, with the result that here too a relatively high current can be used in order to be able to generate a high magnetic field.

In further embodiment examples, it can be provided that the low-temperature shield 10 is designed vacuum-tight with respect to the 300 K-stage 13 or the vacuum bell jar. In the process, the 300 K-stage 13 and the low-temperature shield 10 delimit different volumes, in which, for example, different pressure conditions can be produced and in which optionally different gases and gas mixtures can be present.

Thus, it can be provided for instance that an exchange gas at a defined pressure, for instance helium, is introduced into the space enclosed by the low-temperature shield. A particularly homogeneous temperature distribution between the first contact surface 1, the sample holder 7 and the sample 8 can hereby be achieved, for example. The exchange gas in particular prevents the development of a temperature gradient between the named components, which are in thermal contact with the first contact surface 1.

Moreover, the exchange gas can improve the quality of measurements which are taken through the objective lens element 9 for example, and it can reduce or prevent a possible static charging of the sample 8. Further, a local pressure on the sample 8 can be reduced again through a vacuum-capable design of the low-temperature shield, whereby an ultra-high vacuum is made possible inside the low-temperature shield. The vacuum-tight seal of the low-temperature shield 10 can serve here in particular to additionally improve the conditions for reaching a particularly low pressure.

In further embodiment examples, various combinations of pressure, or vacuum, and gas can be provided in the areas defined by the vacuum bell jar of the 300 K-stage 13 and by the low-temperature shield 10.

In a further embodiment example, the system is integrated in an optical table. This has a table top with an opening, which can, for example, be formed round or in another shape such that the 300 K-stage as a vacuum bell jar can be fixed to the table top. For the fixing, the base 3 can be used, for example, which can be fixed to the table top by means of screws, for instance. Fixing possibilities for the modules 10, 11 of the 50 K-stage 10 or the 4 K-stage 11, respectively can also be integrated in the table.

In the embodiment example, the table further comprises the first 1 and second 2 contact surfaces, wherein these are connected to a refrigerator, which is in turn connected fixedly or detachably to the optical table. In particular, a vibration-damping connection between the table and the refrigerator is provided here.

In further exemplary embodiments, a third contact surface can be provided in the system, which in turn is in thermal contact with at least one further magnetic element. Furthermore, the number of contact surfaces and the magnetic elements that are in thermal contact with them is in principle not limited.

LIST OF REFERENCE NUMBERS

1 first contact surface
2 second contact surface
3 base
4 magnetic element, electromagnetic element, coil (x-direction)
5 magnetic element, electromagnetic element, coil (y-direction)
6 magnetic element, electromagnetic element, coil (z-direction)
7 sample holder
8 sample
9 objective lens element
10 module, low-temperature shield, 50 K-stage
11 module, 4 K-stage
12a, 12b, 12c optical access (300 K-stage)
13 module, 300 K-stage
14a, 14b, 14c, 14d optical access (50 K-stage)

What is claimed is:

1. A system for providing a magnetic field for a sample, comprising:
    a holder for retaining the sample at a site;
    a first contact surface for thermally contacting the holder for the sample, whereby the sample, when positioned on the holder, is in thermal contact with the first contact surface through the holder;
    a second contact surface, which is in thermal contact with a first magnetic element; and
    a second magnetic element in thermal contact with the first contact surface,
    wherein the first magnetic element is fixed to a low-temperature shield, and the low-temperature shield is in thermal contact with the second contact surface.

2. The system according to claim 1, wherein at least a third contact surface is provided which is in thermal contact with a third magnetic element.

3. The system according to claim 1, wherein the first magnetic element is coupled to a control unit, wherein the control unit applies a current flow to the first magnetic element in dependence on a predefined magnetic field parameter, such that the magnetic field provided at the site for the sample has the predefined magnetic field parameter.

4. The system according to claim 1 further comprising a third magnetic element which is also in thermal contact with the second contact surface and which is arranged in a pair with the first magnetic element; wherein the first magnetic element and the third magnetic element are arranged in pairs on opposite sides of the site for the sample, such that magnetic fields produced by the pair of first magnetic elements and the pair of third magnetic elements have a common axis which is aligned with the site for the sample.

5. The system according to claim 3, wherein the first magnetic element includes two pairs of first magnetic elements which are in thermal contact with the second contact surface, wherein a first of the two pairs of first magnetic elements is arranged such that an axis of a corresponding magnetic field that can be generated by the first of the two pairs of first magnetic elements runs perpendicular to an axis of a corresponding magnetic field that can be generated by a second of the two pairs of first magnetic elements.

6. The system according to claim 1, wherein the first magnetic element and/or the second magnetic element comprises a superconducting material.

7. The system according to claim 1, wherein the first magnetic element and/or the second magnetic element comprises a metal or semimetal.

8. The system according to claim 1, wherein the low-temperature shield comprises a circumferential wall, which surrounds the sample and which is provided with at least one optical access opening.

9. A table with the system according to claim 1, wherein the first contact surface and the second contact surface are formed in an area of a table top of the table.

10. The system according to claim 6, wherein the superconducting material is a high-temperature superconductor.

* * * * *